(12) United States Patent
Takagi

(10) Patent No.: US 10,054,849 B2
(45) Date of Patent: Aug. 21, 2018

(54) LIGHT SOURCE DEVICE AND PROJECTOR

(71) Applicant: SEIKO EPSON CORPORATION, Tokyo (JP)

(72) Inventor: Chigusa Takagi, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/590,576

(22) Filed: May 9, 2017

(65) Prior Publication Data
US 2017/0336703 A1  Nov. 23, 2017

(30) Foreign Application Priority Data

May 17, 2016 (JP) .................. 2016-098480
Mar. 14, 2017 (JP) .................. 2017-048367

(51) Int. Cl.
| | |
|---|---|
| G03B 21/20 | (2006.01) |
| F21V 23/00 | (2015.01) |
| F21V 23/06 | (2006.01) |
| H01L 25/075 | (2006.01) |
| H01L 33/62 | (2010.01) |

(Continued)

(52) U.S. Cl.
CPC ........ *G03B 21/2013* (2013.01); *F21V 23/001* (2013.01); *F21V 23/06* (2013.01); *G03B 21/204* (2013.01); *H01L 25/0753* (2013.01); *H01L 33/62* (2013.01); *F21Y 2105/10* (2016.08); *F21Y 2115/30* (2016.08); *H01L 2224/48091* (2013.01); *H01L 2924/16195* (2013.01); *H01L 2924/19107* (2013.01)

(58) Field of Classification Search
CPC .............. G03B 21/14; G03B 21/2013; G03B 21/2033; H01L 2224/48091; H01L 2224/48464; H01L 2224/8592; F21Y 2105/00; F21Y 2105/10
See application file for complete search history.

(56) References Cited

U.S. PATENT DOCUMENTS

2003/0128341 A1* 7/2003 Li ................. G02B 27/0994
                                                             353/53
2004/0207816 A1* 10/2004 Omoda ............. G03B 21/2013
                                                             353/31

(Continued)

FOREIGN PATENT DOCUMENTS

| EP | 2365525 A2 | 9/2011 |
|---|---|---|
| JP | 2006-114661 A | 4/2006 |
| JP | 2014-116227 A | 6/2014 |

OTHER PUBLICATIONS

Oct. 4, 2017 extended Search Report issued in European Patent Application No. 17171601.2.

*Primary Examiner* — Sultan Chowdhury
(74) *Attorney, Agent, or Firm* — Oliff PLC

(57) ABSTRACT

A light source device includes: a base substrate; a plurality of light emitting elements disposed on the base substrate along each of an X-direction and a Y-direction crossing the X-direction; and a first polarity terminal and a second polarity terminal for supplying power to the plurality of light emitting elements. The first polarity terminal and the second polarity terminal project from one side of the base substrate in the X-direction as viewed in a Z-direction orthogonal to the X-direction and the Y-direction.

16 Claims, 12 Drawing Sheets

(51) Int. Cl.
*F21Y 115/30* (2016.01)
*F21Y 105/10* (2016.01)

(56) References Cited

U.S. PATENT DOCUMENTS

| | | | | |
|---|---|---|---|---|
| 2009/0152579 A1* | 6/2009 | Udagawa | ............ | H01L 33/0079 257/98 |
| 2010/0155742 A1* | 6/2010 | Takeuchi | ................ | H01L 33/02 257/77 |
| 2011/0163343 A1* | 7/2011 | Kim | .................. | G02F 1/133603 257/98 |
| 2011/0310600 A1* | 12/2011 | Lehman | .................... | F21K 9/90 362/217.14 |

\* cited by examiner

LIGHT SOURCE DEVICE AND PROJECTOR

CROSS REFERENCE TO RELATED APPLICATION

The entire disclosure of Japanese Patent Application No. 2016-098480, filed on May 17, 2016 and Japanese Patent Application No. 2017-048367, filed on Mar. 14, 2017 is expressly incorporated by reference herein.

BACKGROUND

1. Technical Field

The present invention relates to a light source device and a projector.

2. Related Art

A light source for illumination including a plurality of light emitting elements has been known in the related art (e.g., see JP-A-2014-116227). Moreover, a technique of enclosing a light receiving element and a light source such as a semiconductor laser in a package has been proposed (e.g., see JP-A-2006-114661).

The light source for illumination disclosed in JP-A-2014-116227 includes a t source device (light emitting diode (LED) module), lead wires, and a lighting circuit.

The LED module includes a substrate and a plurality of LEDs (light emitting elements) disposed on the substrate. The plurality of LEDs include a light emitting element row formed of a plurality of LEDs arranged in one row, and a plurality of the light emitting element rows are disposed on the substrate. Moreover, metal wiring and a pair of terminals are formed on the substrate. The LEDs of each of the light emitting element rows are connected in series wits wires, and both ends of each of the light emitting element rows are connected to the pair of terminals via the metal wiring.

Two lead wires are provided so as to be inserted through through-holes respectively provided in the pair of terminals, and each of the two lead wires is connected to the terminal and the lighting circuit. The LED module emits light with power supplied to the pair of terminals via the lighting circuit and the lead wires.

JP-A-2006-114661 discloses an optical semiconductor device including elements such as a light receiving element and a semiconductor laser, and a package that accommodates this element. In addition, the drawing of terminals that project both sides of the package is disclosed in JP-A-2006-114661.

However, the technique disclosed in JP-A-2014-116227 has a problem in that the thickness of the device is increased because of the configuration in which the lead wires are inserted through the substrate of the light source device. Therefore, when the light source device disclosed in JP-A-2014-116227 is configured using the configuration of the terminals disclosed in JP-A-2006-114661, there arises a problem in that the planar size of the device is increased. Moreover, since a circuit that drives the elements has to be connected to the terminals on both sides of the package, the planar size of a drive circuit is also increased. In particular, when an apparatus including a plurality of light source devices is configured, the problem becomes remarkable.

SUMMARY

An advantage of some aspects of the invention is to solve at least a part of the problems described above, and the invention can be implemented as the following forms or application examples.

Application Example 1

A light source device according to this application example includes: a base substrate; a plurality of light emitting elements disposed on the base substrate along each of a first direction and a second direction crossing the first direction; and a first polarity terminal and a second polarity terminal for supplying power to the plurality of light emitting elements, wherein the first polarity terminal and the second polarity terminal project from one side of the base substrate in the first direction as viewed in a third direction orthogonal to the first direction and the second direction.

According to this configuration, the light source device includes the plurality of light emitting elements disposed on the base substrate, and the first polarity terminal and the second polarity terminal (input terminals). The input terminals project from one side of the base substrate as viewed in the third direction. With this configuration, it is possible to provide the light source device that emits high luminance light and is of small size.

Moreover, since it is sufficient that a drive circuit of the light source device is configured so as to be connected to the input terminals provided on one side of the base substrate, it is possible to reduce the size of the drive circuit and thus to reduce the size of an apparatus on which this light source device is mounted. Thus, it is possible to provide the light source device that can contribute to reducing the size of the apparatus. In particular, a remarkable advantageous effect is provided for an apparatus on which a plurality of light source devices are mounted.

Application Example 2

In the light source device according to the application example, it is preferable that the base substrate is formed in a rectangular shape in a plan view, that the first direction is a direction crossing one side of the rectangular shape, and that the first polarity terminal and the second polarity terminal project from the one side as viewed in the third direction.

According to this configuration, the base substrate is formed in a rectangular shape in a plan view, and the input terminals are disposed as described above. Therefore, it is possible to provide the light source device that is of small size while disposing the plurality of light emitting elements in an orderly manner in the first direction and the second direction.

Application Example 3

In the light source device according to the application example, it is preferable that the plurality of light emitting elements are disposed such that a plurality of light emitting element groups each composed of one row of the light emitting elements disposed along the first direction are disposed along the second direction, and that the one row of the light emitting elements in the light emitting element group are connected in series.

According to this configuration, the drive circuit can be configured so as to collectively drive the plurality of light emitting elements in each of the light emitting element groups. Thus, it is possible to provide the light source device that allows the drive circuit to be simplified.

Application Example 4

In the light source device according to the application example, it is preferable that the light source device further includes holding portions disposed on the base substrate and each holding the light emitting element group such that the light emitting element emits light to the side opposite to the base substrate, that the holding portion includes a first surface on which the light emitting element group is disposed, and a second surface different from the first surface, and that a wiring layer to which the second polarity terminal is connected is provided on the second surface.

According to this configuration, it is possible to provide the light source device that efficiently emits light to the side opposite to the base substrate.

Moreover, the holding portion and the light emitting element group held by the holding portion can be configured as a sub-unit in which the holding portion and the light emitting element group are integrated together. Therefore, compared to a configuration in which the light emitting elements are individually disposed on the base substrate, it is possible to manufacture the light source device in which a variation in optical characteristics of the plurality of light emitting elements is reduced, or the light source device can be repaired by exchanging the sub-unit in the case of the occurrence of a failed light emitting element. Thus, it is possible to provide the light source device that efficiently emits light to the side opposite to the base substrate, has less variation in optical characteristics, and can be easily repaired.

Application Example 5

In the light source device according to the application example, it is preferable that the light source device further includes an auxiliary substrate disposed on the side of the base substrate opposite to the plurality of light emitting elements, that the second polarity terminal is connected to the plurality of light emitting element groups via the auxiliary substrate, and that the auxiliary substrate is provided outside a region where the plurality of light emitting elements are disposed as viewed in the third direction.

According to this configuration, since the light source device includes the auxiliary substrate, it is possible to improve the flexibility of the connection path between each of the light emitting element groups and the second polarity terminal.

Moreover, since the auxiliary substrate is provided outside the region where the plurality of light emitting elements are disposed as viewed in the third direction, a heat dissipating member can be disposed on the side of the base substrate opposite to this region. With this configuration, even when the light source device is configured to include the auxiliary substrate, it is possible to provide the light source device that can efficiently dissipate heat.

Application Example 6

In the light source device according to the application example, it is preferable that the first polarity terminal and the second polarity terminal are connected to each individual one of the plurality of light emitting element groups.

According to this configuration, since the light emitting element groups can be driven on a group-by-group basis, it is possible to provide the light source device in which a luminance variation and the like of each of the light emitting element groups are suppressed.

Application Example 7

In the light source device according to the application example, it is preferable that the first polarity terminal and the second polarity terminal are alternately disposed along the second direction.

According to this configuration, it is possible to provide a drive circuit for each of the light emitting element groups, or to provide a drive circuit that drives the light emitting element groups next to each other to thereby dispose the drive circuit with high space efficiency. Thus, it is possible to provide the light source device that can contribute to reducing the size of the drive circuit while suppressing a luminance variation and the like of each of the light emitting element groups.

Application Example 8

In the light source device according to the application example, it is preferable that the first polarity terminal is connected to each individual one of the plurality of light emitting element groups, and that the second polarity terminal is connected in common to the plurality of light emitting element groups.

According to this configuration, since the second polarity terminal is connected in common to the plurality of light emitting element groups, the number of input terminals can be reduced in the light source device. Thus, it is possible to provide the light source device that can contribute to further reducing the size of the drive circuit.

Application Example 9

A projector according to this application example includes: the light source device described above; a light modulator that modulates light emitted from the light source device; and a projection optical device that projects light modulated by the light modulator.

According to this configuration, since the projector includes the light source device described above, it is possible to project a bright image while reducing the size of the projector.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
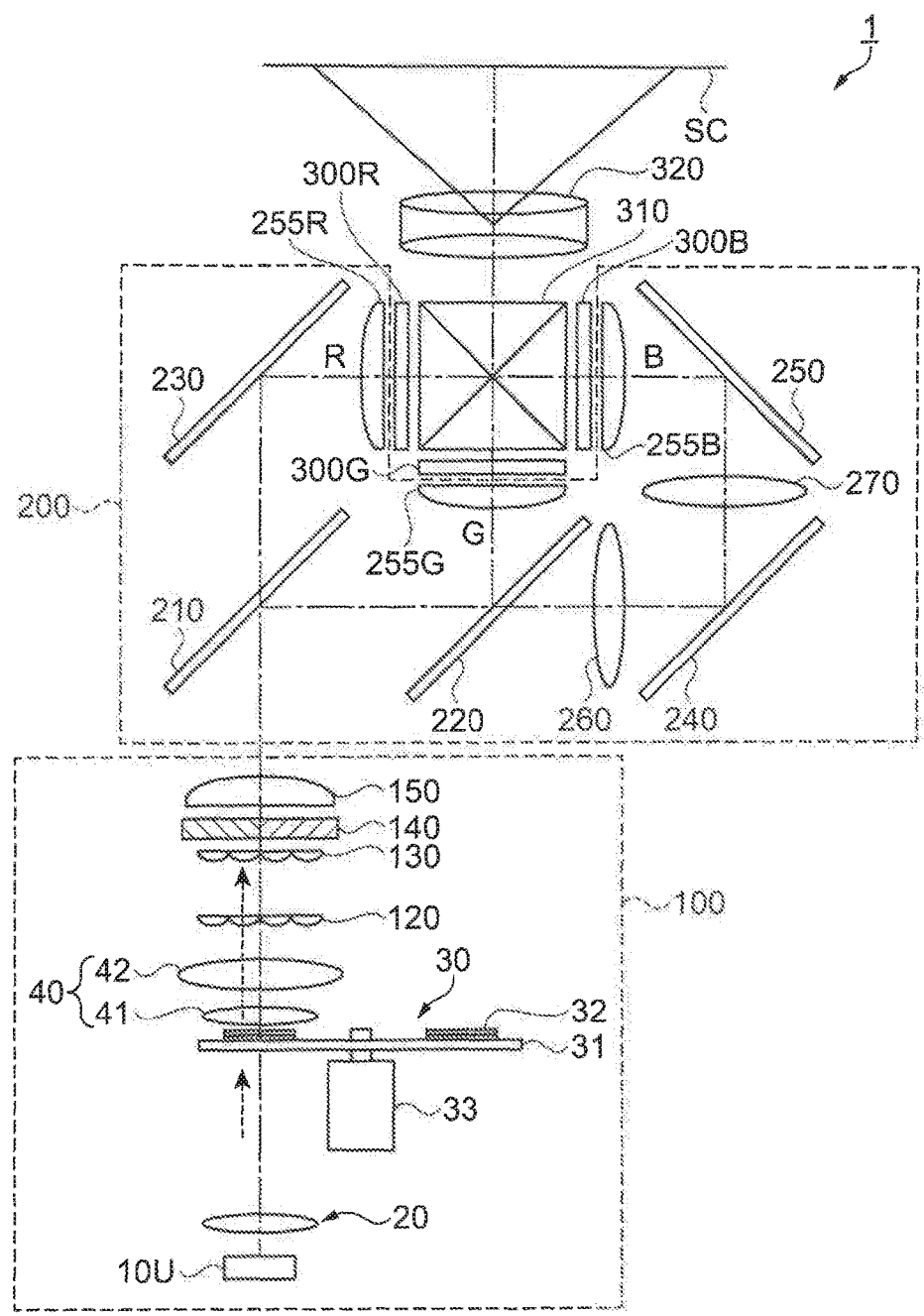
FIG. 1 is a schematic view showing an optical system of a projector according to a first embodiment.

Hereinafter, a light source device and a projector according to a first embodiment will be described with reference to the drawings. In the drawings shown below, dimensions and ratios of components are appropriately different from actual ones in order to show the components in sizes recognizable on the drawings.

Main Configuration of Projector

FIG. 1 is a schematic view showing an optical system of a projector 1 according to the embodiment.

As shown in FIG. 1, the optical system of the projector 1 includes an illumination device 100, a color separation optical system 200, light modulators 300R, 300G, and 300B, a cross dichroic prism 310 as a color combining optical device, and a projection optical device 320. Although not shown in the drawing, the projector 1 includes, in addition to the optical system described above, a control section that controls the operation of the projector 1, a power source device that supplies power to the illumination device 100 and the control section, a cooling device that cools the light modulators 300R, 300G, and 300B and the power source device, and an external housing that accommodates these devices therein.

The illumination device 100 includes a light source unit 10U, a condensing optical system 20, wavelength conversion device 30 including a phosphor 32, a collimating optical system 40, lens arrays 120 and 130, a polarization conversion element 140, and a superimposing lens 150.

Figure 2:
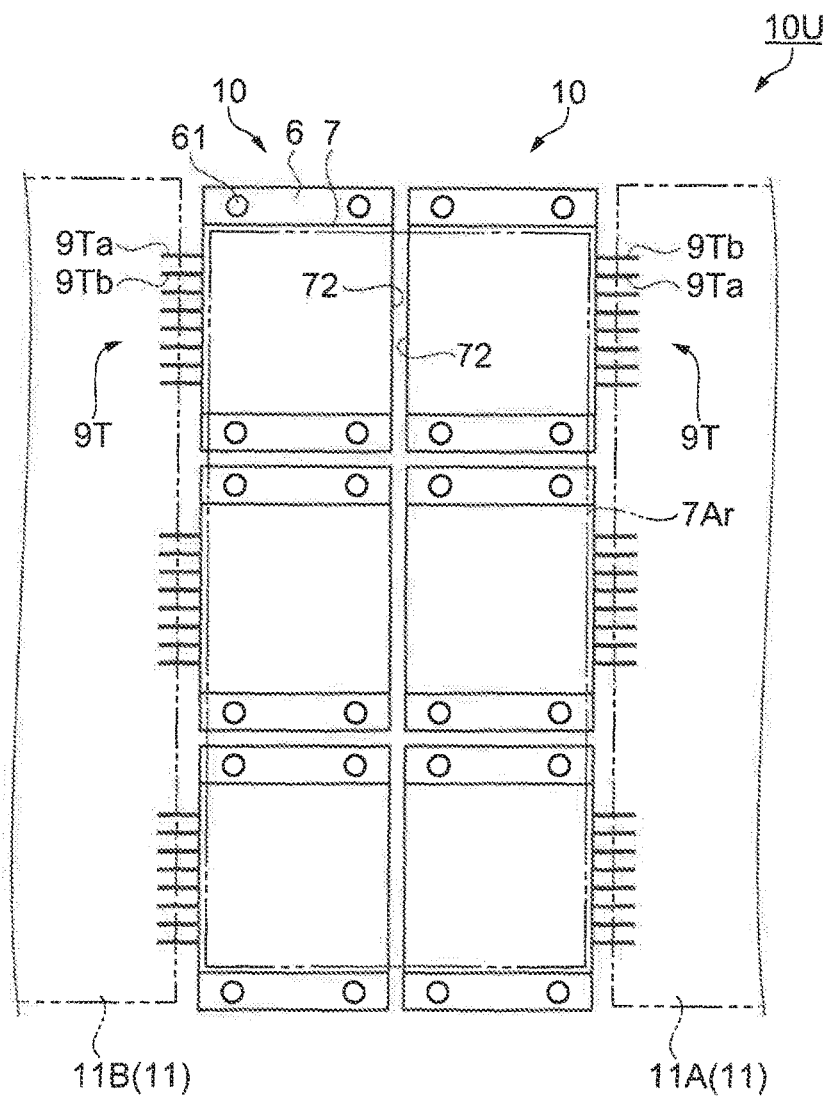
FIG. 2 is a plan view schematically showing a light source unit of the first embodiment.

FIG. 2 is a plan view schematically showing the light source unit 10U.

As shown in FIG. 2, the light source unit 10U includes a plurality of light source devices 10 and a circuit section 11. The light source unit 10U of the embodiment includes six light source devices 10.

The light source device 10 includes a plurality of light emitting elements 5 (see FIG. 3), which will be described in detail later. The light emitting element 5 is a semiconductor laser and emits blue light (e.g., light having an emission intensity peak at approximately 445 nm) that excites the phosphor 32. The light emitting element 5 may be a semiconductor laser that emits light having an emission intensity at a wavelength other than 445 nm.

Although not described in detail herein, the circuit section 11 includes a circuit element that drives the light source device 10 and a circuit board on which the circuit element is mounted, and is connected to the control section.

The condensing optical system 20 condenses the light emitted from the light source unit 10U onto the phosphor 32.

The wavelength conversion device 30 includes a disk 31, the phosphor 32 provided in the circumferential direction on the disk 31, and a motor 33 that rotates the disk 31.

The disk 31 is formed of a member that transmits the light emitted from the light emitting element 5, for example, silica glass, quartz crystal, sapphire, or the like.

The phosphor 32 is provided on the side of the disk 31 opposite to the condensing optical system 20, and is disposed so as to overlap the focal position of the light condensed by the condensing optical system 20. The phosphor 32 transmits a portion of the light (blue light) emitted from the light source device 10 while absorbing the remaining of the light to emit yellow light. The light emitted from the phosphor 32 forms light composed of blue light and yellow light combined together.

The collimating optical system 40 includes a first lens 41 that suppresses the spreading of the light emitted from the phosphor 32, and a second lens 42 that collimates light incident from the first lens 41. The collimating optical system 40 collimates the light emitted from the phosphor 32 as a whole.

The lens array 120 has a configuration in which small lenses are arranged in a matrix, and divides the light emitted from the collimating optical system 40 into a plurality of partial lights. The lens array 130 has a configuration substantially similar to that of the lens array 120, and substantially superimposes, in conjunction with the superimposing lens 150, the plurality of partial lights on the surfaces of the light modulators 300R, 300G, and 300B. The polarization conversion element 140 converts unpolarized light emitted from the lens array 130 to linearly polarized light that can be used in the light modulators 300R, 300G, and 300B.

The color separation optical system 200 includes dichroic mirrors 210 and 220, mirrors 230, 240, and 250, field lenses 255R, 255G, and 255B, and relay lenses 260 and 270.

The dichroic mirror 210 reflects green light (G light) and blue light (B light) of the light emitted from the illumination device 100 while transmitting red light (R light) thereof. The dichroic mirror 220 reflects the G light of the light reflected the dichroic mirror 210 while transmitting the B light thereof.

The R light transmitted through the dichroic mirror 210 is reflected by the mirror 230, collimated by the field lens 255R, and then incident on the light modulator 300R. The G light reflected by the dichroic mirror 210 is collimated by the field lens 255G and then incident on the light modulator 300G. The B light transmitted through the dichroic mirror 220 passes through the relay lens 260, is reflected by the mirror 240, passes through the relay lens 270, is reflected by the mirror 250, and then incident on the field lens 255B. The B light incident on the field lens 255B is collimated by the field lens 255B and incident on the light modulator 300B.

The light modulators 300R, 300G, and 300B each include a transmissive liquid crystal panel and polarizers provided in front of and behind the liquid crystal panel, and are connected to the control section via cables (not shown). The light modulators 300R, 300G, and 300B modulate, based on an image signal supplied thereto, lights of the respective colors emitted from the color separation optical system 200, and form image lights of the respective colors.

The cross dichroic prism 310 has a substantially square shape, in a plan view, formed of four right-angle prisms bonded together. Two dielectric multilayer films are formed at interfaces between the right-angle prisms bonded together. The cross dichroic prism 310 reflects the R light and the B light respectively modulated by the light modulators 300R and 300B while transmitting the G light modulated by the light modulator 300G, to combine the image lights of three colors.

The projection optical device 320 is configured to include a plurality of lenses (not shown) and enlarges and projects the light combined by the cross dichroic prism 310 onto a projection surface SC.

Configuration of Light Source Device

Here, the light source device 10 will be described in detail.

Figure 3:
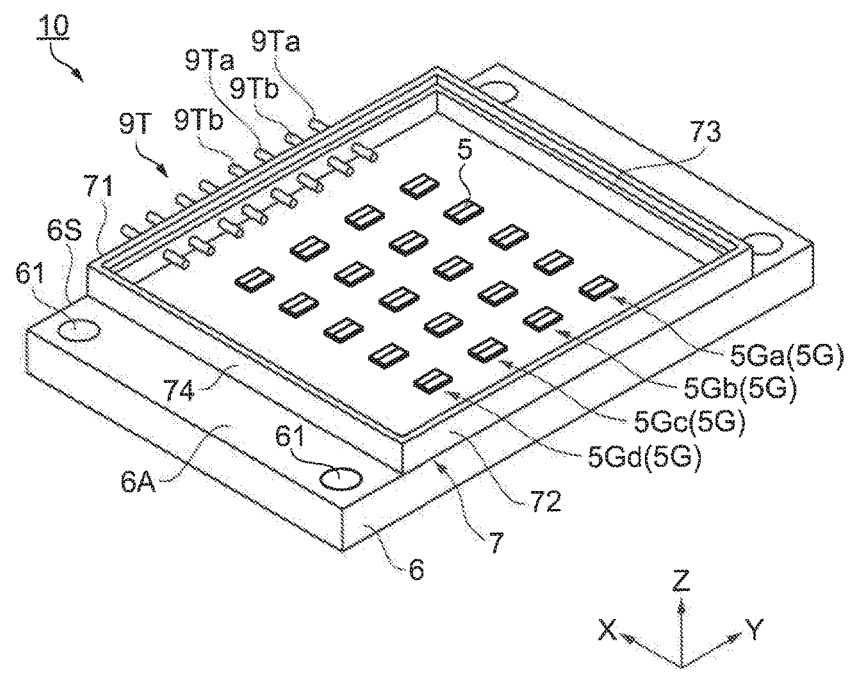
FIG. 3 is a perspective view schematically showing a light source device of the first embodiment.
Figure 4:
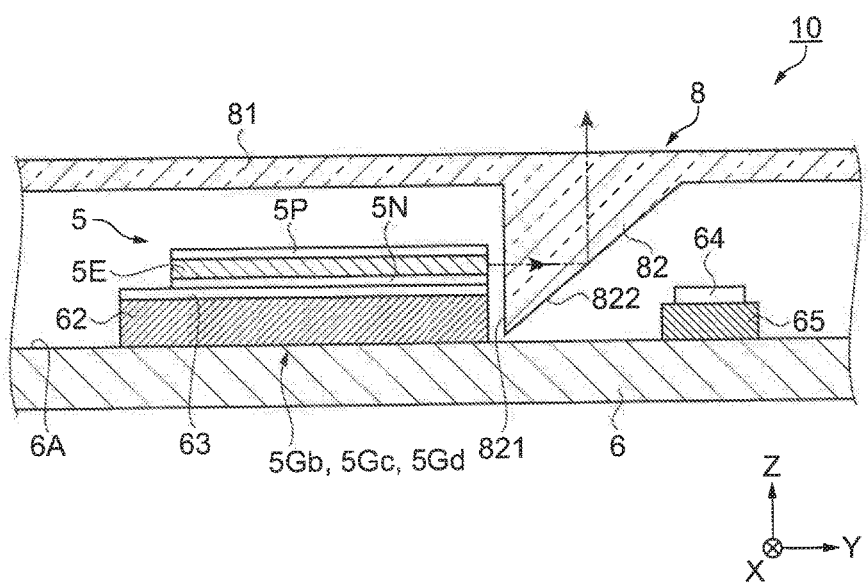
FIG. 4 is a partial cross-sectional view schematically showing the light source device of the first embodiment.

FIG. 3 is a perspective view schematically showing the light source device 10. FIG. 4 is a partial cross-sectional view schematically showing the light source device 10. In FIG. 3, a cover member 8 (see FIG. 4) and a connection portion 90 (see FIG. 5), which will be described later, are omitted.

Figure 5:
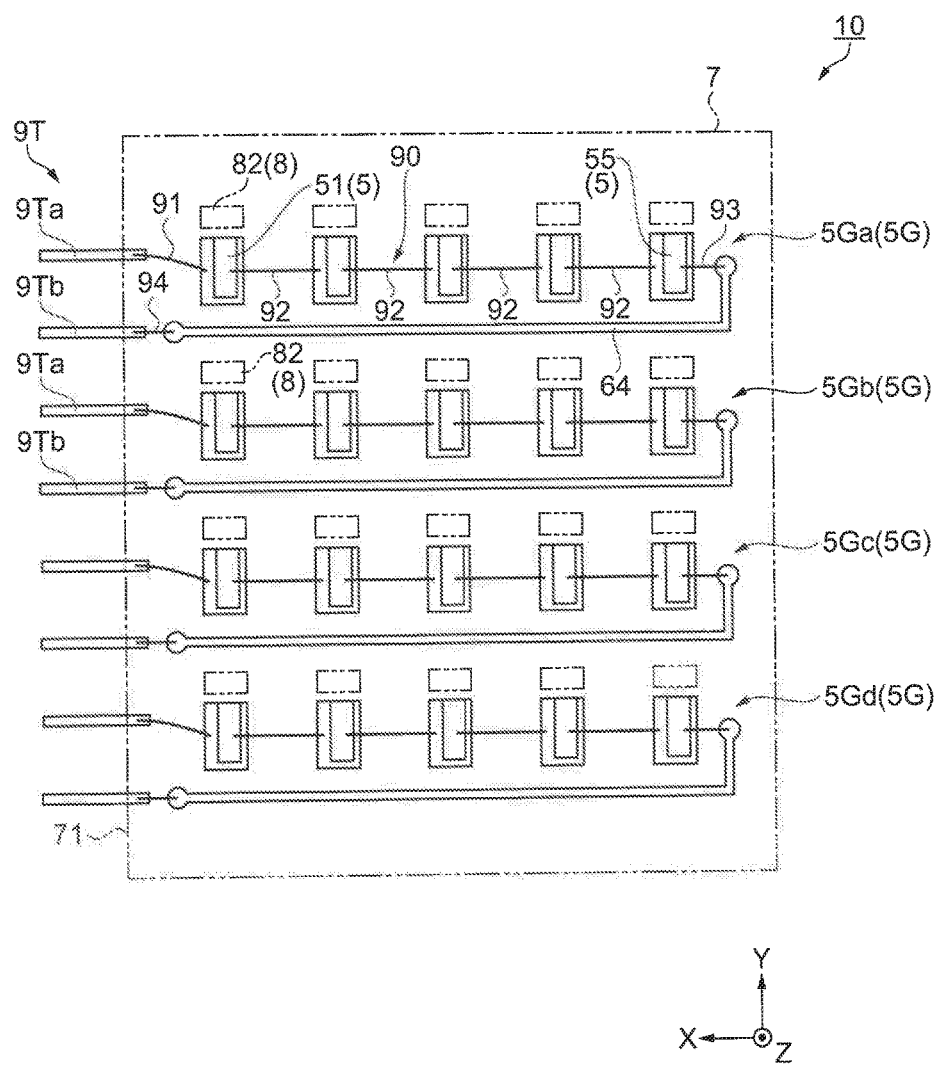
FIG. 5 is a plan view of the light source device of the first embodiment.

As shown in FIGS. 3 and 4, the light source device 10 includes, in addition to the plurality of light emitting elements 5, a base substrate 6, a frame member 7, the cover member 8, input terminals 9T, and the connection portion 90 (see FIG. 5).

The base substrate 6 is formed in a rectangular shape in a plan view as shown in FIG. 3 using a material having a high thermal conductivity such as copper. As shown in FIG. 4, a submount 62, a first conductive layer 63, a second conductive layer 64, and an insulating layer 65 are provided on one surface (upper surface 6A) of the base substrate 6.

The submount 62 is formed of ceramics such as aluminum nitride or alumina. The first conductive layer 63 is a metal film such as copper or gold, and is provided on the submount 62. The submounts 62 and the first conductive layers 63 are provided in a matrix corresponding to the plurality of light emitting elements 5. The plurality of light emitting elements 5 are stacked on the first conductive layers 63 provided in a matrix.

The second conductive layer 64, which will be described in detail later, is formed of a material similar to that of the first conductive layer 63 and is used for wiring for supplying power to the light emitting element 5. The insulating layer 65 insulates the base substrate 6 from the second conductive layer 64.

As shown in FIG. 3, screw insertion holes 61 through which screws are inserted are provided at the four corners of the base substrate 6.

As shown in FIG. 3, the plurality of light emitting elements 5 are disposed on the upper surface 6A side of the base substrate 6 along each of a first direction and a second direction crossing the first direction. In the embodiment, the first direction is a direction crossing (a direction substantially orthogonal to) one side 6S of the base substrate 6 having a rectangular shape, and the second direction is a direction crossing the first direction. For convenience of description, the first direction is defined as the X-direction, and the second direction is defined as the y-direction. Moreover, a third direction orthogonal to the first direction (X-direction) and the second direction (Y-direction) is defined as the Z-direction. The Z-direction is the thickness direction of the base substrate 6.

One row of light emitting elements 5 disposed along the X-direction are defined as a light emitting element group 5G. The light source device 10 includes a plurality of the light emitting element groups 5G disposed along the Y-direction. One row of the light emitting elements 5 in each of the light emitting element groups 5G are connected in series. As shown in FIG. 3, the light source device 10 of the embodiment includes four light emitting element groups 5G each composed of five light emitting elements 5. That is, the light source device 10 of the embodiment includes 20 light emitting elements 5. The number of light emitting elements 5 disposed along the X-direction and the Y-direction may be other than that described above. Moreover, the number of light emitting element groups 5G included in the light source device 10 may be odd or even; however, the number of light emitting element groups 5G may be preferably even because it is possible to employ a configuration in which the light emitting element groups 5G next to each other are commonly driven (the configuration of the circuit section 11).

As shown in FIG. 3, the input terminal 9T includes a first polarity terminal 9Ta and a second polarity terminal 9Tb that are provided to each individual one of the light emitting element groups 5G for supplying power to each of the light emitting element groups 5G, which will be described in detail later. The input terminal 9T projects from one side of the base substrate 6 in the X-direction as viewed in the Z-direction. For convenience of description, the side toward the input terminal 9T in the X-direction is referred to as a "+X-side", the right side in the Y-direction as viewed in FIG. 3 is referred to as a "+Y-side", and the upper surface 6A side of the base substrate 6 in the Z-direction is referred to as an "upper side (+Z-side)".

As shown in FIG. 4, the light emitting element 5 includes a light emitting portion 5E in which an active layer, a cladding layer, and the like are stacked, and a first electrode 5N and a second electrode 5P that are respectively formed on both surfaces of the light emitting portion 5E. The light emitting element 5 is disposed such that the first electrode 5N is electrically connected to the first conductive layer 63 formed on the submount 62. The light emitting element 5 emits light in the +Y-direction with power supplied to the first electrode 5N and the second electrode 5P.

The frame member 7 is formed in a rectangular frame shape in a plan view using ceramics such as aluminum nitride or alumina. As shown in FIG. 3, the frame member 7 surrounds the plurality of light emitting elements 5 in the X-direction and the Y-direction on the base substrate 6. Specifically, the frame member 7 includes side walls 71 and 72 respectively surrounding the +X-side and -X-side of the plurality of light emitting elements 5, and side walls 73 and 74 respectively surrounding the +Y-side and -Y-side of the plurality of light emitting elements 5. Terminal insertion holes 71h (see FIGS. 6 and 7) through which the input terminals 9T are inserted are formed in the side wall 71.

The cover member 8 is formed of a light-transmissive member such as glass, quartz, or resin, and includes a main body portion 81 and light guide portions 82 as shown in FIG. 4. The main body portion 81 is formed in a rectangular shape in a plan view, and closes an opening portion of the frame member 7 on the upper side.

The light guide portions 82 are provided respectively corresponding to the plurality of light emitting elements 5, and each direct the light emitted from the light emitting element 5 in the +Z-direction. As shown in FIG. 4, the light guide portion 82 projects from the lower surface of the main body portion 81 toward the base substrate 6, and is provided on the light exiting side (+Y-side) of the light emitting element 5. Specifically, the light guide portion 82 includes a light incident surface 821 along the Z-direction and an inclined surface 822 whose distance from the light emitting element 5 increases from the leading edge of the light incident surface 821 toward the main body portion 81. The light emitted from the light emitting element 5 is incident from the light incident surface 821, reflected by the inclined surface 822 in the +Z-direction, and emitted from the main body portion 81. As described above, the plurality of light emitting elements 5 emit light in the +Y-direction, and each of the light guide portions 82 directs the light emitted from the light emitting element 5 in the +Z-direction.

The input terminal 9T and the connection portion 90 will be described.

Figure 6:
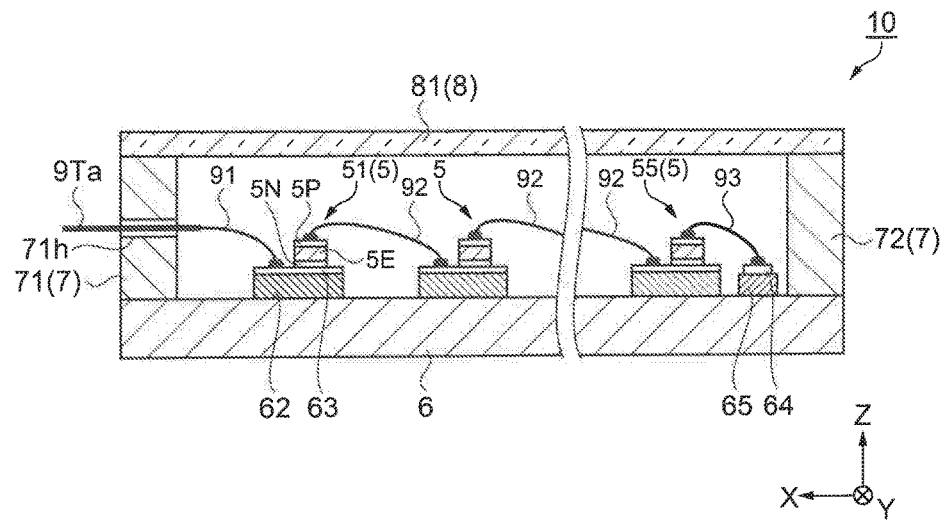
FIG. 6 is a cross-sectional view of the light source device of the first embodiment, showing a portion where light emitting elements are disposed as viewed in the Y-direction.
Figure 7:
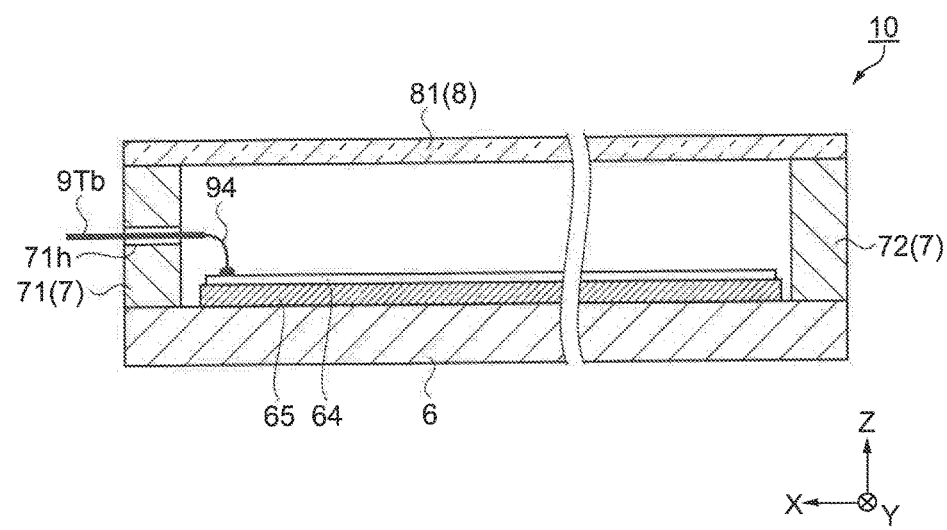
FIG. 7 is a cross-sectional view of the light source device of the first embodiment, showing a portion between light emitting element groups next to each other as viewed in the Y-direction.

FIGS. 5, 6, and 7 are schematic views for explaining wiring of the plurality of light emitting elements 5. Specifically, FIG. 5 is a plan view of the light source device 10. FIG. 6 is a cross-sectional view of the light source device 10, showing a portion where the light emitting elements 5 are disposed as viewed in the Y-direction. FIG. 7 is a cross-sectional view of the light source device 10, showing a portion between the light emitting element groups 5G next to each other as viewed in the Y-direction.

As described above and as shown in FIG. 5, one row of the light emitting elements 5 in each of the light emitting element groups 5G are connected in series. The input terminal 9T includes the first polarity terminal 9Ta and the second polarity terminal 9Tb, which are connected to each individual one of the light emitting element groups 5G.

As shown in FIGS. 6 and 7, the first polarity terminal 9Ta and the second polarity terminal 9Tb are respectively and individually inserted through the terminal insertion holes 71h in the side wall 71 of the frame member 7, and are disposed such that a portion of each of the first polarity terminal 9Ta and the second polarity terminal 9Tb is located inside the frame member 7 while another portion thereof projecting from the side wall 71. That is, the first polarity terminal 9Ta and the second polarity terminal 9Tb project from one side (+X-side) of the base substrate 6 in the X-direction (first direction) as viewed in the Z-direction (third direction). Moreover, as viewed in the Z-direction (third direction), the first polarity terminal 9Ta and the second polarity terminal 9Tb project from the one side 6S (see FIG. 3) of the base substrate 6 formed in a rectangular shape in a plan view. A low-melting-point glass is filled in the terminal insertion holes 71h through which the first polarity terminal 9Ta and the second polarity terminal 9Tb are respectively inserted.

The connection portion 90 is configured so as to series-connect the first polarity terminal 9Ta, one row of the light emitting elements 5 in each of the light emitting element groups 5G, and the second polarity terminal 9Tb.

Here, in the four light emitting element groups 5G, the lights emitting element group 5G that is disposed closest to the +Y-side is defined as a light emitting element group 5Ga, and the light emitting element groups 5G that are disposed successively from the light emitting element group 5Ga in the −Y-direction are defined as a light emitting element group 5Gb, a light emitting element group 5Gc, and a light emitting element group 5Gd. In the light emitting element group 5G, the light emitting element 5 that is disposed closest to the +X-side is referred to as a "light emitting element 51" and the light emitting element 5 that is disposed closest to the −X-side is referred to as a "light emitting element 55".

Here, the connection portion 90 will be described focusing on the light emitting element group 5Ga.

The connection portion 90 is a wire made of metal, and includes a first connection portion 91, second connection portions 92, a third connection portion 93, and a fourth connection portion 94 as shown in FIG. 5. Connections using the first connection portion 91 to the fourth connection portion 94 are performed by wire bonding.

As shown in FIG. 5, the first connection portion 91 connects the first polarity terminal 9Ta with the light emitting element 51. Specifically, as shown in FIG. 6, the first connection portion 91 connects a portion of the first polarity terminal 9Ta located inside the frame member 7 with the first conductive layer 63 to which the first electrode 5N of the light emitting element 51 is connected.

The second connection portions 92 each connects the light emitting elements next to each other in one row of the light emitting elements 5. Specifically, as shown in FIG. 6, the second connection portion 92 connects the second electrode 5P of the light emitting element 5 with the first conductive layer 63 to which the first electrode 5N of the light emitting element 5 next to the −X-side of the light emitting element 5 described above is connected.

The third connection portion 93 connects the second electrode 5P of the light emitting element 55 with the second conductive layer 64.

As shown in FIGS. 5 and 7, the second conductive layer 64 extends in the −Y-direction from the −X-side of the light emitting element 55, bends in the +X-direction, passes between the light emitting element group 5Ga and the light emitting element group 5Gb next to the −Y-side of the light emitting element group 5Ga, and then extends to the vicinity of the second polarity terminal 9Tb. Moreover, as shown in FIGS. 4 and 5, the second conductive layer 64 is formed to pass through the light emitting element group 5Ga and the light guide portions 82 corresponding to the light emitting elements 5 of the light emitting element group 5Gb.

The fourth connection portion 94 connects the second conductive layer 64 with a portion of the second polarity terminal 9Tb located inside the frame member 7.

As described above, the light emitting element group 5G is connected in series via the second connection portions 92. The first polarity terminal 9Ta is connected to the first electrode 5N of the light emitting element 51 via the first connection portion 91 and the first conductive layer 63. The second polarity terminal 9Tb is connected to the second electrode 5P of the light emitting element 55 via the fourth connection portion 94, the second conductive layer 54, and the third connection portion 93.

The light emitting element group 5Gb to the light emitting element group 5Gd are each connected similarly to the fight emitting element group 5Ga. The first polarity terminal 9Ta and the second polarity terminal 9Tb are alternately disposed along the Y-direction as shown in FIG. 5. The light source device 10 of the embodiment is supplied with power via the first polarity terminal 9Ta as a cathode and the second polarity terminal 9Tb as an anode. The light source device 10 can be configured so as to be supplied with power via the first polarity terminal 9Ta as an anode and the second polarity terminal 9Tb as a cathode.

Returning to FIG. 2, the plurality of light source devices 10 included in the light source unit 10U are screw-fixed to a member (not shown) with screws (not shown) inserted through the screw insertion holes 61. In the plurality of light source devices 10, two light source devices 10 are disposed with their side walls 72 facing each other, and three sets of the two light source devices are arranged in parallel (arranged in two rows in the horizontal direction and three rows in the vertical direction as viewed in FIG. 2). That is, in the light source unit 10U, the frame members 7 each surrounding the plurality of light emitting elements 5 in the light source device 10 are disposed so as to be brought together. The input terminals 9T of the light source unit 10U are disposed on both sides of a frame region 7Ar occupied by the six frame members 7. The plurality of light emitting elements 5 included in the light source unit 10U are disposed in the frame region 7Ar.

The circuit section 11 includes a first circuit section 11A corresponding to the input terminals 9T on one side of the frame region 7Ar, and a second circuit section 11B corresponding to the input terminals 9T on the other side of the frame region 7Ar. The input terminals 9T are connected to the first circuit section 11A or the second circuit section 11B by soldering or the like.

As described above, in the light source unit 10U, the frame members 7 are brought together, and the input terminals 9T are disposed on both sides of the frame region 7Ar.

Here, the light source unit 10U will be described in comparison with a configuration using a related art.

Figure 8:
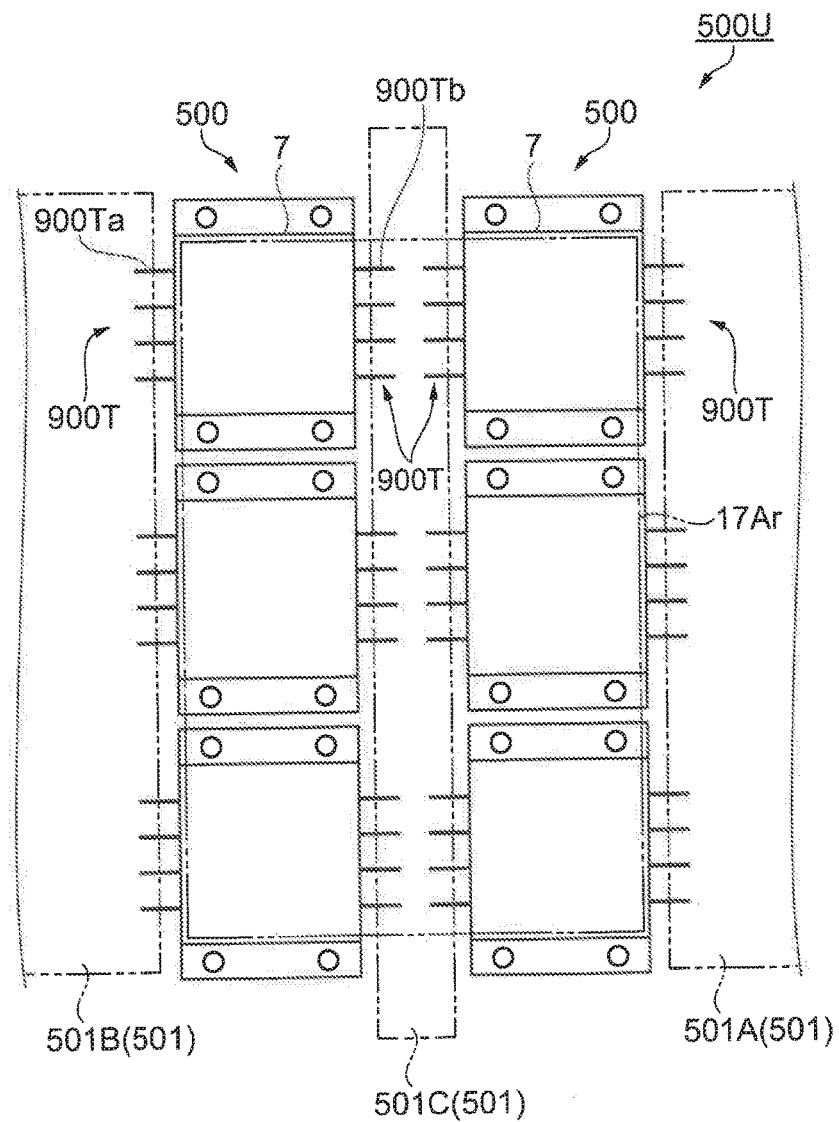
FIG. 8 is a schematic view of a light source unit using a related art.

FIG. 8 is a schematic view of a light source unit 500U using the related art.

As shown in FIG. 8, the light source unit 500U includes a plurality of light source devices 500 and a circuit section 501.

The light source device 500 includes input terminals 900T (first polarity terminals 900Ta and second polarity terminals 900Tb). Unlike the light source unit 10U of the embodiment, the light source device 500 is configured such that the first polarity terminals 900Ta are disposed on one side of the frame member 7 and that the second polarity terminals 900Tb are disposed on the other side of the frame member 7. As shown in FIG. 8, the light source devices 500 are arranged in two rows in the horizontal direction and three rows in the vertical direction in the light source unit 500U similarly to the light source unit 10U of the embodiment. Moreover, in the light source unit 500U, the input terminals 900T of each of the light source devices 500 are disposed so as to be located in the horizontal direction. That is, the input terminals 900T of the light source unit 500U are disposed on both sides of a frame region 17Ar occupied by the six frame members 7 and between the light source devices 500 disposed in two rows in the horizontal direction. That is, the frame region 17Ar of the light source unit 500U is larger than the frame region 7Ar of the light source unit 10U in the embodiment.

Moreover, the circuit section 501 requires, in addition to a first circuit section 501A to which the input terminals 900T on one side of the frame region 17Ar are connected and a second circuit section 501B to which the input terminals 900T on the other side of the frame region 17Ar are connected, a third circuit section 501C to which the input terminals 900T disposed between the light source devices 500 disposed in two rows in the horizontal direction are connected.

As described above, in the light source unit 10U of the embodiment, the input terminals 9T are not disposed between the plurality of light source devices 10. Therefore, the frame region 7Ar is formed smaller than the frame region 17Ar of the light source unit 500U, and the light source unit 10U emits light evenly from within the frame region 7Ar. In addition, the circuit section 501 of the light source unit 500U is composed of three circuit sections (the first circuit section 501A, the second circuit section 501B, and the third circuit section 501C), whereas the circuit section 11 of the light source unit 10U is composed of two circuit sections (the first circuit section 11A and the second circuit section 11B).

Figure 9:
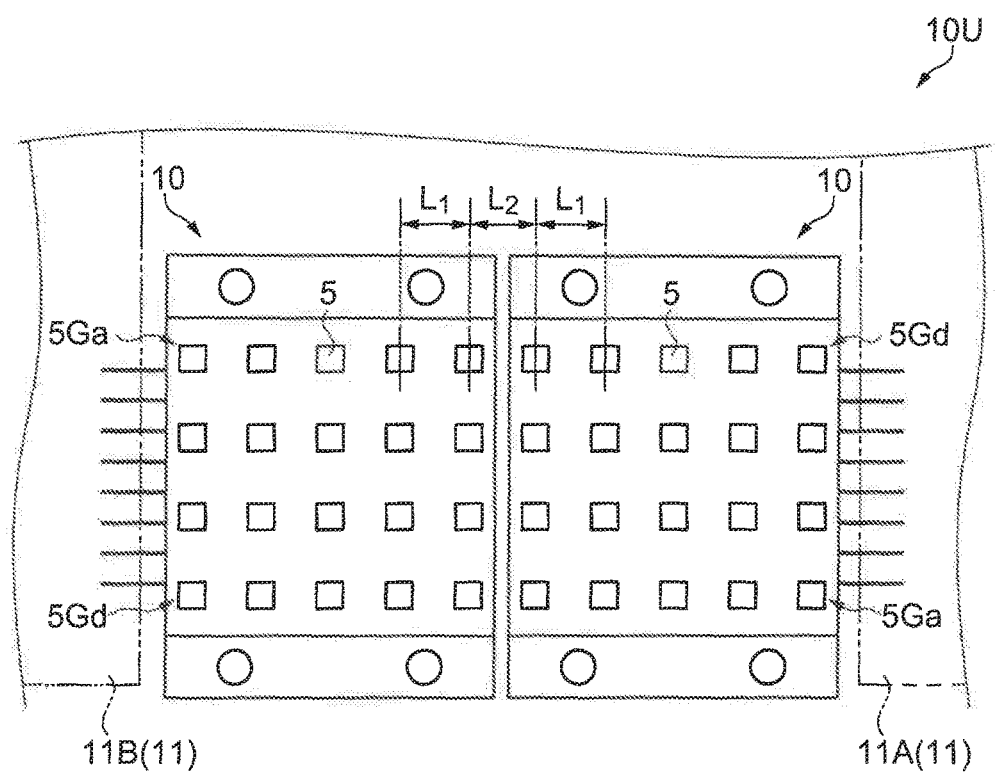
FIG. 9 is a plan view schematically showing a portion of the light source unit of the first embodiment.

FIG. 9 is a plan view schematically showing a portion of the light source unit 10U of the embodiment, which is a schematic view for explaining the arrangement of the light emitting elements 5.

As shown in FIG. 9, the light emitting elements 5 in each of the light source devices 10 are disposed at a pitch $L_1$ the horizontal direction. The light source devices 10 provided in parallel in the horizontal direction are preferably configured such that a pitch $L_2$ between the light emitting elements 5 next to each other is equal to the pitch $L_1$. With this configuration, the light source unit 10U can emit light with suppressed bias in light intensity distribution from the region where the plurality of light emitting elements 5 are disposed. For example, in a configuration in which a plurality of lenses corresponding to the plurality of light emitting elements 5 are disposed, the pitches between the plurality of lenses can also be made equal to each other, and thus the manufacture can be facilitated.

According to the embodiment as has been described above, the following advantageous effects can be obtained.

(1) The light source device 10 includes the plurality of light emitting elements 5 and therefore can emit high luminance light. Moreover, since the input terminals 9T are provided on one side (the side wall 71) of the frame member 7, it is possible to reduce the size of the light source device 10.

(2) since the plurality of frame members 7 are disposed to be brought together without the input terminals 9T disposed between the plurality of light source devices 10, it is possible to reduce the size of the light source unit 10U.

Moreover, since the frame region 7Ar where the plurality of light emitting elements 5 are disposed is formed small, it is possible in the light source unit 10U to suppress the loss (scattering to the surroundings, etc.) of light to be emitted and increase the use efficiency of the light. Moreover, it is possible to reduce the size of an optical component (e.g., the condensing optical system 20) disposed at the rear stage on the optical path of the light source unit 10U.

(3) Since the circuit section 11 is composed of two circuit sections (the first circuit section 11A and the second circuit section 11B), it is possible to further reduce the size of the light source unit 10U.

(4) Since the base substrate 6 is formed in a rectangular shape in a plan view, it is possible to reduce the size of the light source device 10 while disposing the plurality of light emitting elements 5 in an orderly manner in the first direction and the second direction.

(5) One row of the light emitting elements 5 in the light emitting element group 5G are connected in series. With this configuration, the circuit section 11 can be configured so as to collectively drive the plurality of light emitting elements 5 in each of the light emitting element groups 5G. Thus, it is possible to provide the light source device 10 that allows the circuit section 11 to be simplified.

(6) The first polarity terminal 9Ta and the second polarity terminal 9Tb are connected to each individual one of the plurality of light emitting element groups 5G. With this configuration, since the light emitting element groups 5G can be driven on a group-by-group basis, it is possible to provide the light source device 10 in which a luminance variation and the like of each of the light emitting element, groups 5G are suppressed.

(7) The first polarity terminal 9Ta and the second polarity terminal 9Tb are alternately disposed along the Y-direction. With this configuration, it is possible to provide a drive circuit for each of the light emitting element groups 5G or to provide a drive circuit that drives the light emitting element groups 5G next to each other to thereby dispose the drive circuit with high space efficiency. Thus, it is possible to provide the light source device 10 that can contribute to reducing the size of the circuit section 11 while suppressing a luminance variation and the like of each of the light emitting element groups 5G.

Since the projector 1 includes the light source unit 10U described above, it is possible to project a bright image while reducing the size thereof.

Second Embodiment

Hereinafter, a light source device 400 according to a second embodiment will be described with reference to the drawing. In the following description, components similar to those of the first embodiment are denoted by the same reference numerals and signs, and the detailed description of the components is omitted or simplified.

The light source device 400 of the embodiment includes wiring different from the wiring of the light source device 10 of the first embodiment.

Figure 10:
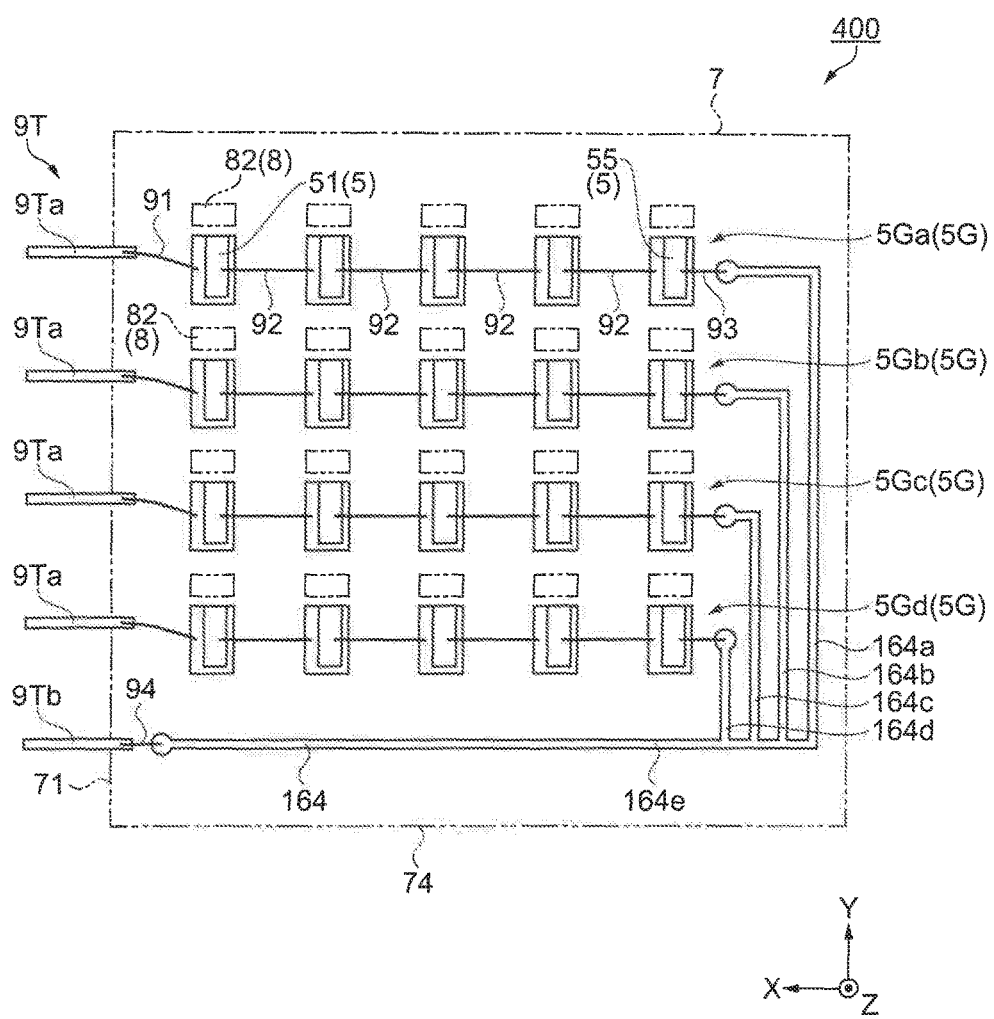
FIG. 10 is a schematic view for explaining wiring of a light source device of a second embodiment.

FIG. 10 is a schematic view for explaining the wiring of the light source device 400.

Similarly to the light source device 10 of the first embodiment, the light source device 400 of the embodiment includes the four light emitting element groups 5Ga, 5Gb, 5Gc, and 5Gd, and one row of the light emitting elements 5 in each of the light emitting element groups 5G are connected in series.

The light source device 400 includes a second conductive layer 164 having patterns different from the pattern of the second conductive layer 64 (see FIG. 5) in the light source device 10 of the first embodiment. Specifically, as shown in FIG. 10, the second conductive layer 164 includes patterns 164a, 164b, 164c, and 164d and a common pattern 164e.

The pattern 164a extends in the −X-direction from the −X-side of the light emitting element 55 of the light emitting element group 5Ga, bends in the −Y-direction, and then extends to the vicinity of the side wall 74.

The patterns 164b and 164c extend and bend similarly to the pattern 164a, and extend to the vicinity of the side wall 74.

The pattern 164d extends in the −Y-direction from the −X-side of the light emitting element 55 of the light emitting element group 5Gd, and extends to the vicinity of the side wall 74.

The common pattern 164e is connected to portions of the patterns 164a, 164b, 164c, and 164d in the vicinity of the side wall 74, passes between the light emitting element group 5Gd and the side wall 74 as viewed in the Z-direction, and extends to the vicinity of the second polarity terminal 9Tb.

Then, the common pattern 164e is connected to the second polarity terminal 9Tb via the fourth connection portion 94.

As described above, in the light source device 400 of the embodiment, the first polarity terminal 9Ta is connected to each individual one of the light emitting element groups 5G, and the second polarity terminal 9Tb is connected in common to the four light emitting element groups 5G. That is, the ht source device 400 includes a plurality of (four in the embodiment) first polarity terminals 9Ta and one second polarity terminal 9Tb.

According to the light source device 400 of the embodiment as has been described above, the following advantageous effect can be obtained.

Since the second polarity terminal 9Tb is connected in common to the plurality of light emitting element groups 5G, the number of input terminals 9T can be reduced in the light source device 400. Thus, it is possible to provide the light source device that can contribute to further reducing the size of the drive circuit.

Third Embodiment

Hereinafter, a light source device 600 according to a third embodiment will be described with reference to the drawings. In the following description, components similar to those of the light source devices 10 and 400 described above are denoted by the same reference numerals and signs, and the detailed description of the components is omitted or simplified.

The light source device 600 of the embodiment includes an auxiliary substrate 610 in addition to the components of the light source devices 10 and 400, and similarly to the light source device 400, the second polarity terminal 9Tb is connected in common to the light emitting element groups 5G. Moreover, the light source device 600 includes a base substrate 16 different from the base substrate 6 described above.

Figure 11:
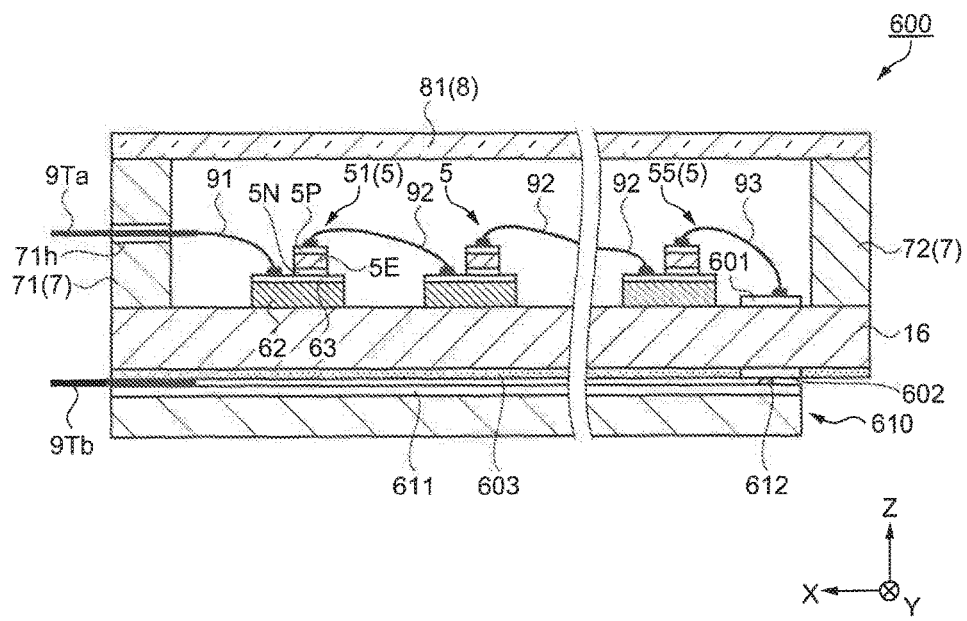
FIG. 11 is a cross-sectional view schematically showing a light source device of a third embodiment.
Figure 12:
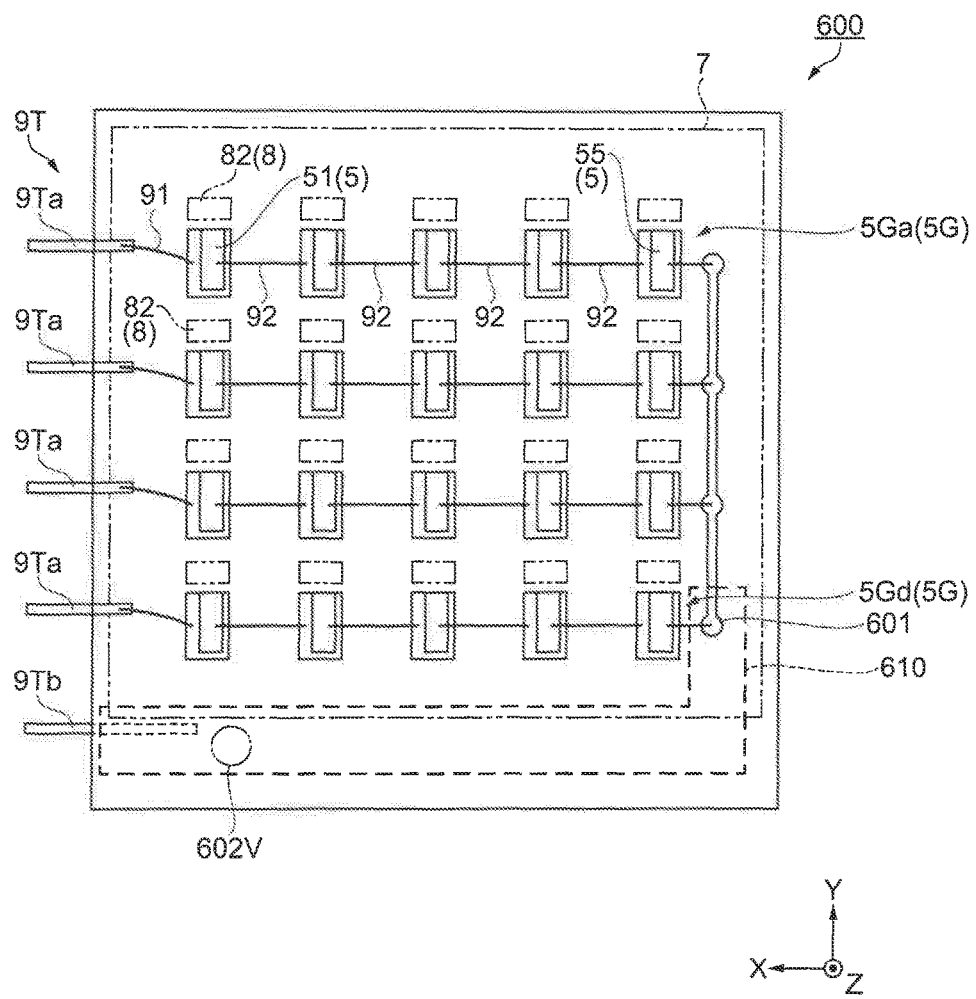
FIG. 12 is a plan view schematically showing the light source device of the third embodiment.

FIG. 11 is a cross-sectional view schematically showing the light source device 600. FIG. 12 is a plan view schematically showing the light source device 600.

As shown in FIGS. 11 and 12, the base substrate 16 includes a common pattern 601 formed on the surface on the light emitting element 5 side, and a connection layer 602 and an insulating layer 603 that are formed on the surface on the side opposite to the light emitting element 5.

The common pattern 601 is formed of gold or the like. The common pattern 601 extends in the Y-direction on the −X-side of the light emitting element groups 5G and is connected in common to the light emitting elements 55 of the light emitting element groups 5G.

The connection layer 602 is formed of gold or the like and provided on the −Z-side of the common pattern 601 as shown in FIG. 11. The insulating layer 603 is formed so as to surround the connection layer 602. Since the base substrate 16 is formed of a metal material such as copper, the common pattern 601 and the connection layer 602 are electrically connected.

As shown in FIG. 11, the auxiliary substrate 610 is provided on the side of the base substrate 16 opposite to the light emitting element 5; and as shown in FIG. 12, the auxiliary substrate 610 is provided outside the region where the light emitting elements 5 are disposed in the plan view. Specifically, the auxiliary substrate 610 extends in the −Y-direction from the −X-side of the light emitting element group 5Gd, bends to the +X-side, and then extends along the X-direction on the −Y-side of the light emitting element group 5Gd.

A wiring pattern 611 is formed on the surface of the auxiliary substrate 610 on the base substrate 16 side. The second polarity terminal 9Tb is connected to an end of the wiring pattern 611 on the +X-side, projects from an end of the auxiliary substrate 610 on the +X-side, and is provided in parallel with the first polarity terminals 9Ta in the plan view as shown in FIG. 12. The second polarity terminal 9Tb is located on the −Z-side of the first polarity terminal 9Ta in the Z-direction, and is connected to the circuit section 11 (see FIG. 2) with a configuration (e.g., a different connector, etc.) different from the connection configuration between the first polarity terminal 9Ta and the circuit section 11 (see FIG. 2).

Moreover, as shown in FIG. 11, the auxiliary substrate 610 is provided with a conducting member 612 connected to the wiring pattern 611 and formed so as to be in contact with the connection layer 602. The conducting member 612 is, for example, a member having a spring property, one end of which is connected to the wiring pattern 611 by soldering or the like and the other end of which is formed so as to be in contact with the connection layer 602.

As described above, the light source device 600 of the embodiment is configured to include the auxiliary substrate 610, the first polarity terminal 9Ta is connected to each individual one of the light emitting element groups 5G, and the second polarity terminal 9Tb is connected in common to the light emitting element groups 5G. The configuration in which the connection layer 602 is provided on the −Z-side of the common pattern 601 has been described; however, in the configuration in which the second polarity terminal 9Tb is connected in common to the light emitting element groups 5G, it is also possible to provide a connection layer 602V (see FIG. 12) in the vicinity of the second polarity terminal 9Tb and provide the conducting member 612 corresponding to the connection layer 602V. In the case of this configuration, the size of the auxiliary substrate 610 can be made smaller than the size described above.

According to the light source device 600 of the embodiment as has been described above, the following advantageous effects can be obtained.

(1) Since the light source device 600 includes the auxiliary substrate 610, it is possible to improve the flexibility of the connection path between each of the light emitting element groups 5G and the second polarity terminal 9Tb.

(2) Since the auxiliary substrate 610 is provided outside the region where the plurality of light emitting elements 5 are disposed, a heat dissipating member can be disposed on the side of the base substrate 16 opposite to this region. With this configuration, even when the light source device 600 is configured to include the auxiliary substrate 610, it is possible to provide the light source device 600 that can efficiently dissipate heat.

Fourth Embodiment

Hereinafter, a light source device 700 according to a fourth embodiment will be described with reference to the drawings. In the following description, components similar to those of the light source device 10 of the first embodiment are denoted by the same reference numerals and signs, and the detailed description of the components is omitted or simplified.

Figure 13:
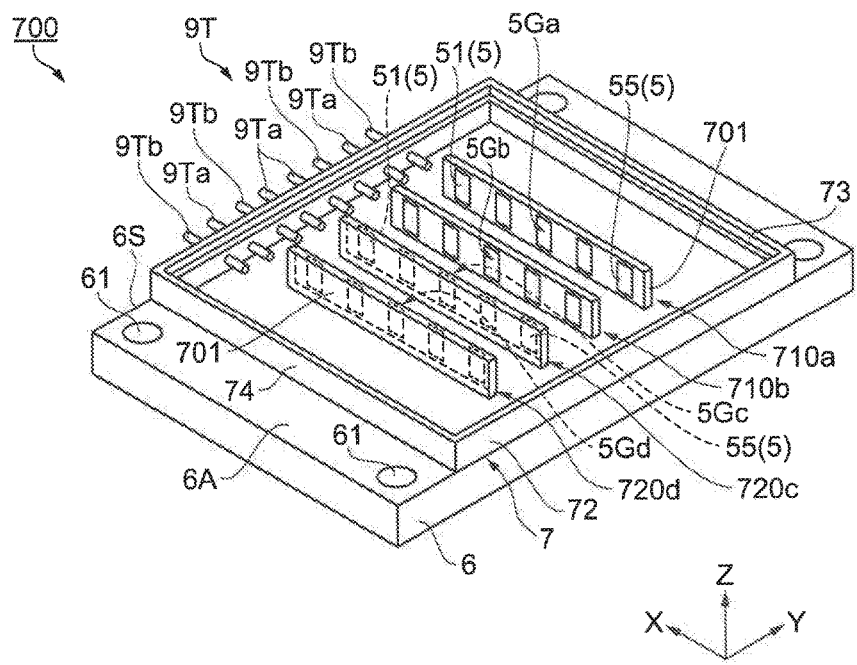
FIG. 13 is a perspective view schematically showing a light source device of a fourth embodiment.
Figure 14:
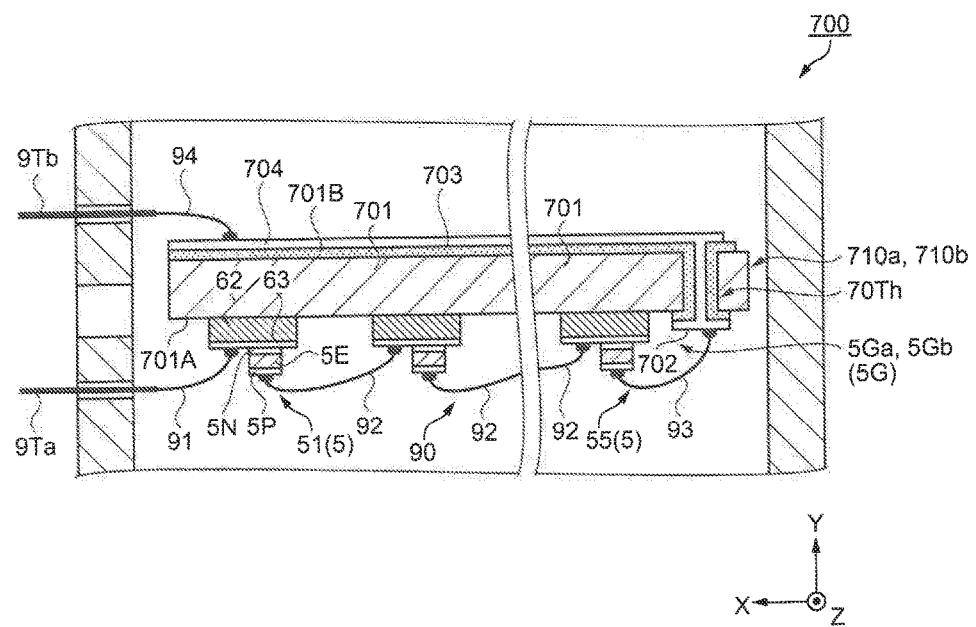
FIG. 14 is a partial cross-sectional view schematically showing the light source device of the fourth embodiment.
Figure 15:
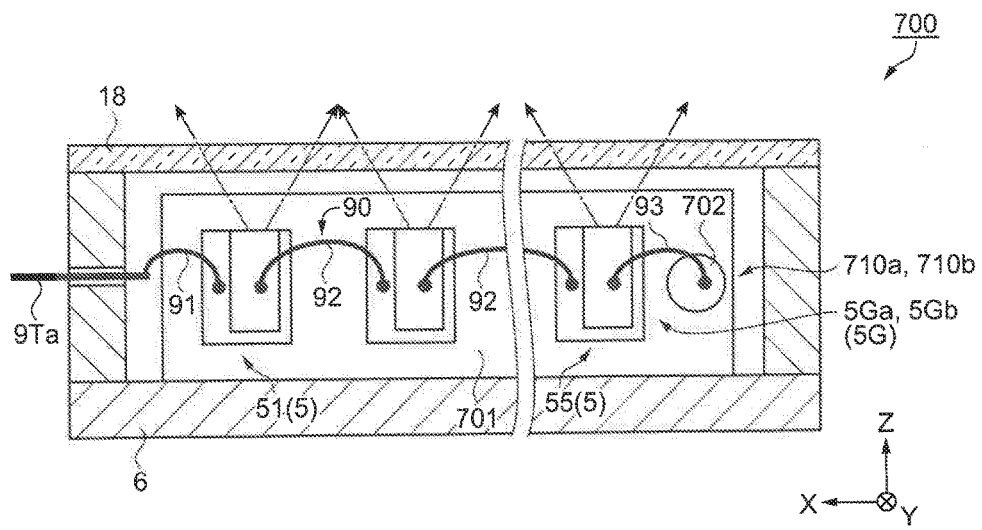
FIG. 15 is a cross-sectional view schematically showing the light source device of the fourth embodiment.

FIG. 13 is a perspective view schematically showing the light source device 700. FIG. 14 is a partial cross-sectional view schematically showing the light source device 700 as viewed in the +Z-direction. FIG. 15 is a cross-sectional view schematically showing the light source device 700 as viewed in the −Y-direction. FIGS. 14 and 15 show first sub-units 710a and 710b, which will be described later. The light source device 700 includes a cover member 18 (see FIG. 15) having a shape different from the cover member 8 of the light source device 10; however, the cover member 18 and the connection portion 90 (see FIGS. 14 and 15) are omitted in FIG. 13.

As shown in FIG. 13, the light source device 700 includes holding portions 701 that respectively hold the light emitting element groups 5Ga, 5Gb, 5Gc, and 5Gd. As shown in FIG. 15, each of the light emitting elements 5 is configured to emit light to the side (+Z-direction) opposite to the base substrate 6. The holding portions 701 and the light emitting element groups 5Ga and 5Gb held by the holding portions 701 are defined as the first sub-units 710a and 710b, and the holding portions 701 and the light emitting element groups 5Gc and 5Gd held by the holding portions 701 are defined as second sub-units 720c and 720d.

The holding portion 701 is formed in a rectangular parallelepiped shape using a metal material such as copper. As shown in FIG. 14, the holding portion 701 includes a first surface 701A on which the light emitting element group 5G is held, and a second surface 701B on the side opposite to the first surface 701A.

As shown in FIG. 13, the first sub-units 710a and 710b are disposed such that the light emitting element groups 5Ga and 5Gb are located on the −Y-side of the holding portions 701. The second sub-units 720c and 720d are disposed such that the light emitting element groups 5Gc and 5Gd are located on the +Y-side of the holding portions 701.

In addition, the first sub-units 710a and 710b and the second sub-units 720c and 720d are disposed such that intervals between the light emitting element groups 5G next to each other are the same as each other in the Y-direction. That is, the distance between the holding portion 701 of the first sub-unit 710b and the holding portion 701 of the second sub-unit 720c is larger than the distance between the other holding portions 701 next to each other. With this configuration, the light source device 700 can emit light with suppressed variation in light intensity distribution from the region where the plurality of light emitting elements 5 are disposed, and the concentration of heat generation on the central portion is suppressed. That is, the heat generated by the light emission of the light emitting element 5 is conducted to the holding portion 701; however, since the distance between the holding portions 701 located in the central portion is larger in the light source device 700 as described above, the concentration of heat generation on the central portion is suppressed.

Moreover, as shown in FIGS. 14 and 15, the holding portion 701 is provided with a connection layer 702 on the first surface 701A and a wiring pattern 704 as a wiring layer on the second surface 701B.

The connection layer 702 and the wiring pattern 704 are provided on the holding portion 701 via an insulating layer 703. The connection layer 702 and the wiring pattern 704 are connected through a conducting portion 70Th prodded in a through hole that penetrates the holding portion 701 via the insulating layer 703.

The connection layer 702 is provided on the −X-side of the light emitting element 55, and is connected to the second electrode 5P of the light emitting element 55 via the third connection portion 93.

As shown in FIG. 14, the wiring pattern 704 extends from the vicinity of an end of the holding portion 701 on the −X-side to the vicinity of an end thereof on the +X-side. The second polarity terminal 9Tb is connected to the vicinity of an end of the wiring pattern 704 on the +X-side via the fourth connection portion 94. That is, the second polarity terminal 9Tb is connected to the second electrode 5P of the light emitting element 55 via the fourth connection portion 94, the wiring pattern 704, the conducting portion 70Th, the connection layer 702, and the third connection portion 93.

Moreover, as shown in FIG. 14, the second polarity terminal 9Tb projects on the same side as the first polarity terminal 9Ta, and is provided in parallel with the first polarity terminal 9Ta in the Y-direction.

Since the light emitting element 5 is configured so as to emit light to the side opposite to the base substrate 6, the cover member 18 is formed, as shown in FIG. 15, in a shape that does not require the light guide portion 82 (see FIG. 4) in the cover member 8.

As described above, in the light source device 700 of the embodiment, each of the light emitting elements 5 is configured so as to emit light to the side (+Z-direction) opposite to the base substrate 6, and the first polarity terminal 9Ta and the second polarity terminal 9Tb are connected to each individual one of the light emitting element groups 5G.

According to the light source device 700 of the embodiment as has been described above, the following advantageous effects can be obtained.

(1) In the light source device 700, the holding portion 701 and the light emitting element group 5G held by the holding portion 701 are configured as a sub-unit (the first sub-units 710a and 710b and the second sub-units 720c and 720d) in which the holding portion 701 and the light emitting element group 5G are integrated together. Therefore, compared to a configuration in which the light emitting elements 5 are individually disposed on the base substrate 6, it is possible to manufacture the light source device 700 in which a variation in optical characteristics of the plurality of light emitting elements 5 is reduced, or the light source device 700 can be repaired by exchanging the sub-unit in the case of the occurrence of a failed light emitting element 5. Thus, it is possible to provide the light source device 700 that efficiently emits light to the side opposite to the base substrate 6, has less variation in optical characteristics, and can be easily repaired.

(2) The light source device 700 is configured so as to suppress the concentration of heat generation on the central portion. With this configuration, it is possible to provide the light source device 700 that suppresses temperature rise due to heat generated by the light emission of the light emitting element 5 and easily dissipates heat.

Modified Examples

The embodiments may be modified as follows.

The light source devices 10 and 400 of the embodiments use a semiconductor laser as the light emitting element 5. However, the light emitting element is not limited to a semiconductor laser, and a light source device using a light emitting diode (LED) or the like as the light emitting element may be configured.

In the light source devices 10 and 400 of the embodiments, the base substrate 6 is formed in a rectangular shape in a plan view. However, the base substrate 6 may have a shape other than the rectangular shape as long as the input terminal 9T projects from one side of the base substrate 6 in the first direction as viewed in the third direction. For example, the light source device may be configured such that the base substrate 6 is formed in a shape in which the corners of the rectangular shape are cut, a trapezoid shape, or a shape having a curvature.

Moreover, the light source device 10 of the embodiment is configured so as to be screw-fixed at the screw insertion holes 61 provided in the base substrate 6; however, the light source device may be configured such that the light source device does not include the screw insertion holes 61 and is fixed with the base substrate 6 interposed between other members.

Although the light source unit 10U of the embodiment includes six light source devices 10, the light source unit may be configured so as to include one light source device 10 or a plurality of light source devices 10 other than six. Also in a light source unit including one light source device 10, the size of the light source unit can be reduced because the input terminals 9T are provided on one side of the frame member 7; and also the size of the circuit section 11 can be reduced because it is sufficient that the circuit section 11 is configured so as to be connected to the input terminals 9T.

Although the light source device 10 of the first embodiment is configured such that all of the light emitting elements 5 emit light in one direction (+Y-direction), the light source device is not limited to this configuration.

Figure 16:
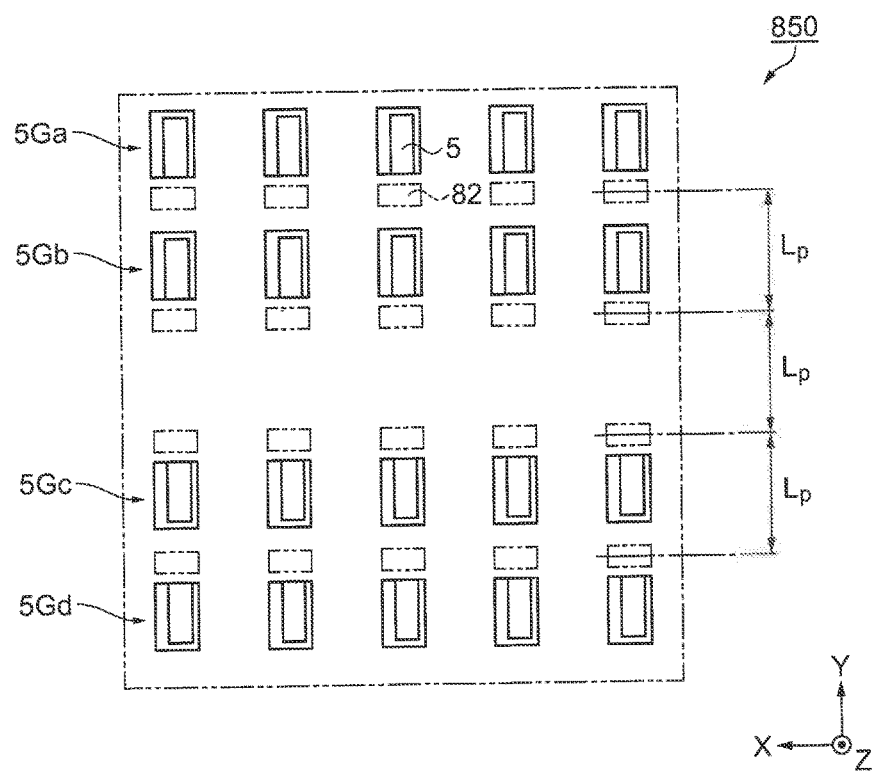
FIG. 16 is a plan view schematically showing a light source device of a modified example.

FIG. 16 is a plan view schematically showing a light source device 850 of a modified example, showing the arrangement of the plurality of light emitting elements 5.

In the light source device 850, the light emitting element groups 5Ga and 5Gb are disposed so as to emit light in the −Y-direction, and the light emitting element groups 5Gc and 5Gd are disposed so as to emit light in the +Y-direction. That is, as shown in FIG. 16, the light guide portions 82 corresponding to the light emitting elements 5 of the light emitting element groups 5Ga and 5Gb are provided on the −Y-side of the light emitting elements 5 in the light emitting element groups 5Ga and 5Gb, and the light guide portions 82 corresponding to the light emitting elements 5 are provided on the +Y-side of the light emitting elements 5 in the light emitting element groups 5Gc and 5Gd. In addition, intervals Lp of the light guide portions 82 in the Y-direction are set to the same pitch.

According to this configuration, light with suppressed variation in light intensity distribution can be emitted from the region where the plurality of light emitting elements 5 are disposed, and the concentration of heat generation on the central portion of the light source device 850 is suppressed. That is, since the light emitting element group 5Gb and the light emitting element group 5Gc, which are located in the central portion of the light source device 850, are more separated than the other light emitting element groups G, the concentration of heat generation on the central portion of the light source device 850 is suppressed.

In the third embodiment, the configuration in which the second polarity terminal 9Tb is connected in common to the plurality of light emitting element groups 5G (an electrical connection similar to the connection in the second embodiment) has been shown. However, it is also possible to employ a configuration in which the second polarity terminal 9Tb is connected to each individual one of the plurality of light emitting element groups 5G similarly to the light source device 10 of the first embodiment. In the case of this configuration, instead of the common pattern 601, a pattern that is connected to the light emitting elements 55 of each of the light emitting element groups 5G is formed, and wiring connected to this pattern is provided on the auxiliary substrate. Moreover, an insulating layer is provided between each of the pattern and wiring and the base substrate 16.

According to this configuration, since wiring for connecting the second polarity terminals 9Tb is not provided between the light emitting element groups 5G next to each other on the base substrate 16 but the wiring is provided on the auxiliary substrate 610, it is possible to reduce the size in the Y-direction.

In the fourth embodiment, it is also possible to employ a configuration in which an insulating member is provided between the base substrate 6 and the holding portion 701. In the case of this configuration, the through hole and the insulating layer 703 become unnecessary, and the holding portion 701 can also be used as an electrical connection portion.

In the fourth embodiment, the configuration in which the second polarity terminal 9Tb is connected to each individual one of the light emitting element groups 5G (an electrical connection similar to the connection in the first embodiment) has been shown. However, it is also possible to employ a configuration in which the second polarity terminal 9Tb is connected in common to the light emitting elements 55 of the plurality of light emitting element groups 5G similarly to the light source device 400 of the second embodiment. In the case of this configuration, the through hole and the insulating layer 703 become unnecessary, and the holding portion 701 and the base substrate 6 can also be used as electrical connection portions.

The light source device 700 of the fourth embodiment is configured to include the light emitting element groups 5G disposed on different sides with respect to the holding portions 701 like the first sub-units 710a and 710b and the second sub-units 720c and 720d. However, the light source device may have a configuration in which all of the light emitting element groups 5G are disposed on the same side with respect to the holding portions 701.

In the light source device 700 (see FIG. 15) of the fourth embodiment, a lens to change the traveling direction of the light emitted from each of the light emitting elements 5 may be disposed on the +Z-side of the cover member 18. Moreover, the cover member 18 (see FIG. 15) may be configured so as to have the shape of this lens.

Although the light source device 10 of the embodiment includes the light emitting element 5 that emits blue light, light is not limited to blue light. The light source device 10 including the light emitting element 5 that emits light in other wavelength bands may be configured.

Although the illumination device 100 of the embodiment includes one light source unit 10U, the illumination device may be configured to include first and second light source units in which light emitting elements respectively included therein emit lights in different wavelength bands. For example, the illumination device may be configured such that the first light source unit emits excitation light and that the second light source unit emits blue light. In the case of this configuration, it is possible to cause the phosphor to emit yellow light with the excitation light emitted by the first light source unit and to emit white light by combining the yellow light and the blue light emitted by the second light source unit.

Although the projector 1 of the embodiment uses a transmissive liquid crystal panel as the light modulator, the projector may use a reflective liquid crystal panel. Moreover, a micromirror-type light modulator, for example, a digital micromirror device (DMD) or the like may be used as a light modulator.

Although a so-called three-plate system in which three light modulators corresponding to R light, G light, and B light are used is adopted for the light modulators of the embodiment, the invention is not limited to this. A single-plate system may be adopted, or the invention can also be applied to a projector including two, or four or more, light modulators.

What is claimed is:

1. A light source device comprising:
   a base substrate, wherein a top surface of the base substrate is parallel to a plane that extends in a first direction and a second direction crossing the first direction;
   a plurality of light emitting elements disposed on the base substrate along each of the first direction and the second direction crossing the first direction; and
   a first polarity terminal and a second polarity terminal for supplying power to the plurality of light emitting elements, wherein
   the first polarity terminal and the second polarity terminal project from one side of the base substrate in the first direction as viewed in a third direction crossing the first direction and the second direction.

2. The light source device according to claim 1, wherein
   the base substrate is formed in a rectangular shape in a plan view, the first direction is a direction crossing one side of the rectangular shape, and
   the first polarity terminal and the second polarity terminal project from the one side as viewed in the third direction.

3. The light source device according to claim 1, wherein
   the plurality of light emitting elements are disposed such that a plurality of light emitting element groups each composed of one row of the light emitting elements disposed along the first direction are disposed along the second direction, and
   the one row of the light emitting elements in the light emitting element group are connected in series.

4. The light source device according to claim 3, further comprising holding portions disposed on the base substrate and each holding the light emitting element group such that the light emitting element emits light to the side opposite to the base substrate, wherein
   the holding portion includes a first surface on which the light emitting element group is disposed, and a second surface different from the first surface, and
   a wiring layer to which the second polarity terminal is connected is provided on the second surface.

5. The light source device according to claim 3, further comprising an auxiliary substrate disposed on the side of the base substrate opposite to the plurality of light emitting elements, wherein
   the second polarity terminal is connected to the plurality of light emitting element groups via the auxiliary substrate, and
   the auxiliary substrate is provided outside a region where the plurality of light emitting elements are disposed as viewed in the third direction.

6. The light source device according to claim 3, wherein
   the first polarity terminal and the second polarity terminal are connected to each individual one of the plurality of light emitting element groups.

7. The light source device according to claim 6, wherein
   the first polarity terminal and the second polarity terminal are alternately disposed along the second direction.

8. The light source device according to claim 3, wherein
   the first polarity terminal is connected to each individual one of the plurality of light emitting element groups, and
   the second polarity terminal is connected in common to the plurality of light emitting element groups.

9. A projector comprising:
the light source device according to claim 1;
a light modulator that modulates light emitted from the light source device; and
a projection optical device that projects light modulated by the light modulator.

10. A projector comprising:
the light source device according to claim 2;
a light modulator that modulates light emitted from the light source device; and
a projection optical device that projects light modulated by the light modulator.

11. A projector comprising:
the light source device according to claim 3;
a light modulator that modulates light emitted from the light source device; and
a projection optical device that projects light modulated by the light modulator.

12. A projector comprising:
the light source device according to claim 4;
a light modulator that modulates light emitted from the light source device; and
a projection optical device that projects light modulated by the light modulator.

13. A projector comprising:
the light source device according to claim 5;
a light modulator that modulates light emitted from the light source device; and
a projection optical device that projects light modulated by the light modulator.

14. A projector comprising:
the light source device according to claim 6;
a light modulator that modulates light emitted from the light source device; and
a projection optical device that projects light modulated by the light modulator.

15. A projector comprising:
the light source device according to claim 7;
a light modulator that modulates light emitted from the light source device; and
a projection optical device that projects light modulated by the light modulator.

16. A projector comprising:
the light source device according to claim 8;
a light modulator that modulates light emitted from the light source device; and
a projection optical device that projects light modulated by the light modulator.

* * * * *